United States Patent [19]
LeMieux

[11] Patent Number: 5,347,103
[45] Date of Patent: Sep. 13, 1994

[54] CONVECTION FURNACE USING SHIMMED GAS AMPLIFIER

[75] Inventor: Pierre J. LeMieux, Andover, Mass.

[73] Assignee: BTU International, North Billerica, Mass.

[21] Appl. No.: 115,211

[22] Filed: Aug. 31, 1993

[51] Int. Cl.5 .......................... A21B 1/26; F27B 9/10; F27D 7/04
[52] U.S. Cl. ................................ 219/400; 417/197; 239/DIG. 7
[58] Field of Search .................. 219/400, 388; 239/DIG. 7, 416.5, 498, 425.5, 419.5; 15/409, 345, 330; 417/197, 198

[56] References Cited

U.S. PATENT DOCUMENTS

| | | | |
|---|---|---|---|
| 284,962 | 9/1883 | Huston | 417/197 |
| 1,596,837 | 8/1926 | Hopkins | 15/409 |
| 2,295,502 | 9/1942 | Lamp | 392/379 |
| 2,997,510 | 8/1961 | Gier | 219/400 |
| 3,358,979 | 10/1965 | Flynn . | |
| 3,795,367 | 3/1974 | Mocarski | 417/197 |
| 3,806,039 | 4/1974 | Mocarski | 239/417.3 |
| 3,954,254 | 5/1976 | Zimmermann | 266/188 |
| 4,055,870 | 11/1977 | Furutsutsumi | 15/409 |
| 4,135,704 | 1/1979 | Elhaus et al. | 266/261 |
| 4,142,712 | 5/1979 | Hemsath et al. | 266/44 |
| 4,202,661 | 5/1980 | Lazaridis et al. | 432/8 |
| 4,319,921 | 5/1982 | Pryor et al. | 75/65 R |
| 4,336,017 | 6/1982 | Desty | 239/DIG. 7 |
| 4,344,479 | 8/1982 | Bailey | 165/109 |
| 4,354,549 | 10/1982 | Smith | 219/400 |
| 4,373,702 | 2/1983 | Jayaraman et al. | 266/111 |
| 4,373,706 | 2/1983 | Elhaus et al. | 266/252 |
| 4,457,494 | 7/1984 | Fisher | 266/140 |
| 4,728,282 | 3/1988 | May | 431/9 |
| 4,762,981 | 8/1988 | Trestianu | 219/400 |
| 4,789,333 | 12/1988 | Hemsath | 432/176 |
| 4,890,598 | 1/1990 | Kinsworthy | 126/110 D |
| 4,963,091 | 10/1990 | Hoetzl et al. | 432/176 |
| 5,056,586 | 10/1991 | Bemisderfer | 165/1 |
| 5,074,782 | 12/1991 | Hoetzl et al. | 432/176 |
| 5,125,979 | 6/1992 | Swain | 134/7 |

OTHER PUBLICATIONS

Exair-amplifiers Brochure Exair Corporation, Cincinnati, Ohio.

*Primary Examiner*—Teresa J. Walberg
*Attorney, Agent, or Firm*—Weingarten, Schurgin, Gagnebin & Hayes

[57] ABSTRACT

A convection furnace using a shimmed gas amplifier to provide a flow of gas over a heating element is disclosed. The heating element is mounted in a substantially leak proof, pressurizable heating chamber. A gas amplifier in an upper plate of the chamber draws gas from a surrounding plenum into the heating chamber at a high flow rate. The pressure in the chamber increases from the input of pressurized gas and the heating of gas flowing over the heating element. The gas amplifier is provided with a toothed spacing shim which creates a stronger flow into the chamber. The stronger flow is capable of resisting the back pressure on the flow from the high pressure in the chamber. The heated gas passes through a plurality of orifices in a lower plate of the chamber to impinge on product traveling below the heating chamber on a conveyor and is recirculated via the plenum to the gas amplifier. The heat transfer rate in the chamber may be controlled by controlling the input flow rate to the gas amplifier.

24 Claims, 10 Drawing Sheets

CONVECTION FURNACE USING SHIMMED GAS AMPLIFIER

FIELD OF THE INVENTION

This invention relates to convection furnaces and more particularly to forced convection furnaces.

BACKGROUND OF THE INVENTION

Convection furnaces are used for a variety of applications. One particularly useful application is the reflowing of solder in the surface mounting of electronic devices to circuit boards. In such furnaces, boards, having preformed solder on the boards and devices, travel on a conveyor through a plurality of heating zones. Convection heaters above and below the conveyor heat the solder to the reflowing temperature. Fans circulate the air or other gas over the heating elements and to the boards.

Systems which employ fans have certain disadvantages however. Fans and motors which operate above ambient temperatures have reduced life spans and therefore must be continuously cooled. Also, as gas is heated, the gas expands and its density decreases. Thus, although a fan running at a constant level of power consumption moves the same volume of gas, the mass of gas moved is less. To move a mass of heated gas equivalent to a mass of cooler gas, the fan speed must be increased, with a concomitant increase in power consumption.

A further disadvantage is that during solder reflow, an effluent of vaporized flux is driven from the solder, which must be removed immediately, or it will condense on cooler surfaces, such as fan blades, with which it comes into contact. The fan blades must be regularly cleaned to prevent unbalancing and loss of efficiency.

A more recent furnace design has attempted to use a gas amplifier in the top of a sealed, pressurizable box. The gas amplifier introduces a high volume flow of air or other gas into the box. The flow circulates over heating elements to heat the gas, which pressurizes the interior of the box. The heated gas is distributed over a plate having an array of orifices and flows through the orifices to impinge on the product on the conveyor. The gas is recirculated through a return plenum.

Gas amplifiers are based upon the Coanda effect, which describes the phenomenon in which a jet of fluid exiting from a nozzle along a surface tends to follow and adhere to the surface, shown schematically in FIG. 10. If the surface is convexly curved, the jet follows the curvature of the surface. This effect is explained by the jet's entrainment of nearby ambient fluid as it flows. The entrainment of residual ambient fluid by the high velocity fluid depletes the surface fluid, so a pressure differential arises between the side of the jet adjacent the surface, where a partial vacuum or low pressure region arises, and the opposite side of the jet, which is at the ambient pressure. This pressure differential causes the jet to adhere to the surface. Continual entrainment also causes the thickness of the jet to increase. Eventually, if the surface were long enough, the jet would acquire too much mass and would break up. Henri Coanda, a Romanian scientist, studied this effect and determined the optimal curvatures for such surfaces, referred to as the Coanda profile. The profile may comprise a series of short straight segments connected to approximate a curve.

A gas amplifier comprises a body having a fluid flow passage extending therethrough from an entrance to an exit. The entrance to the passage is shaped according to a Coanda profile. A fluid under high pressure (the input) flows radially inwardly into the passage through an annular gap or space at the entrance. One surface of the gap joins and forms part of the Coanda profile of the passage through the amplifier. As the high pressure flow exits the gap, it follows the Coanda profile into the passage and thereby entrains ambient gas (the inflow) through the entrance into its flow. The output flow from the amplifier often continues to entrain some gas adjacent to the exit for a short distance. A prior art gas amplifier is shown in U.S. Pat. No. 3,806,039 to Mocarski.

The annular gap through which the pressurized gas flows typically has a width in the range of 0.001 to 0.003 inch. Small gaps produce higher output gains. However, the opposing faces which define the gap are difficult to machine accurately so that the gap width is even. Also, small gaps are subject to pluggage from small particles. Thus, spacers or shims have been used to set the gap, as shown in the patent to Mocarski. The spacer in Mocarski has radially inwardly directed teeth which set the gap width, while the input flow passes through the spaces between the teeth. The teeth, however, do not protrude into the passage, to prevent them from affecting the Coanda flow profile.

The output flow rate of the gas amplifier at the exit is the sum of the input flow rate of the pressurized fluid and the inflow flow rate of ambient fluid which becomes entrained into the input flow. The efficiency or gain, $\beta$, of the gas amplifier may be measured by the output flow rate divided by the input flow rate:

$$\beta = \frac{\text{Input} + \text{Inflow}}{\text{Input}}$$

Gas amplifiers are typically used under ambient conditions to blow air for cooling or to remove particles such as dust or metal filings from an environment. In ambient environments, gains of as high as 30 or 35 have been achieved.

Gas amplifiers also have a theoretical advantage over fans and blowers in moving a heated gas. As gas is heated, for example, by flowing over heating elements, the gas expands. With a gas amplifier, the output flow increases as the gas expands, whereas with a fan, the output flow decreases, as discussed above. However, it has been observed that prior art gas amplifiers do not operate well in heated, pressurized environments, such as are found in convection furnaces. The gain is considerably less than in an ambient environment, and frequently the flow breaks down entirely. Until the present invention, the reasons for this problem apparently were not well understood.

SUMMARY OF THE INVENTION

The present invention provides a convection furnace using a gas amplifier which overcomes the problems of prior art gas amplifiers and is able to operate in a heated, high pressure environment. In the convection furnace, a heating element is mounted in a substantially leak proof, pressurizable heating chamber. A gas amplifier in an upper plate of the chamber draws gas from a surrounding plenum into the heating chamber. A diffuser below the amplifier distributes the gas over one or more heating elements in the chamber. The gas flowing over the heating elements is heated by convective heat transfer.

The heated gas increases the pressure in the chamber. However, the gas amplifier is provided with a toothed shim in the annular gap through which the pressurized gas flows. The teeth of the shim cause the gas to break up to pass around the teeth. The gas reforms downstream of the teeth, although some reduction in potential gain occurs. However, the resulting flow is also stronger and thicker, since it fills in more of the center space of the passage. This stronger, thicker flow is capable of resisting the back pressure on the flow from the high pressure in the chamber. Thus, a net gain results.

Inside the chamber, the heated gas passes through a plurality of orifices in a lower plate of the chamber to impinge on product traveling below the heating chamber on a conveyor. The gas is ducted back to the plenum at the sides of the conveyor for recirculation through the system.

The convection heat transfer rate depends on the flow rate of the gas over the solid heating element. The flow rate is readily controllable by controlling the input flow of pressurized gas to the annular gap of the gas amplifier.

DESCRIPTION OF THE DRAWINGS

The invention will be more fully understood from the following detailed description taken in conjunction with the accompanying drawings in which.

DETAILED DESCRIPTION OF THE INVENTION

Figure 1:
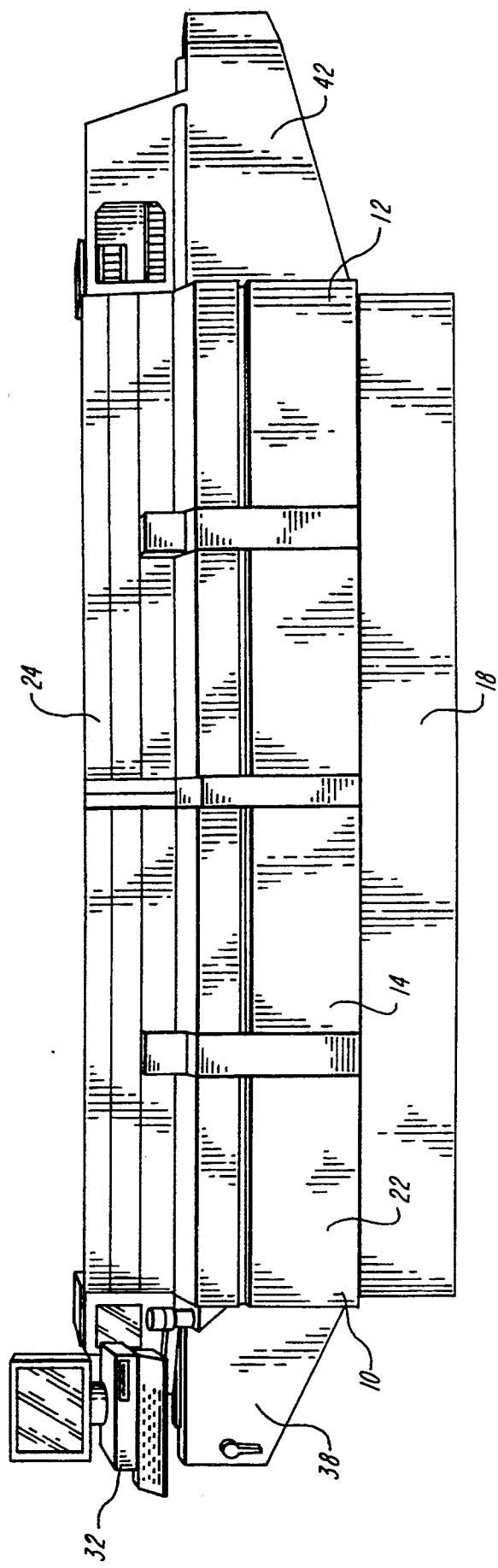
FIG. 1 is an front elevational view of a convection furnace according to the present invention.
Figure 2:
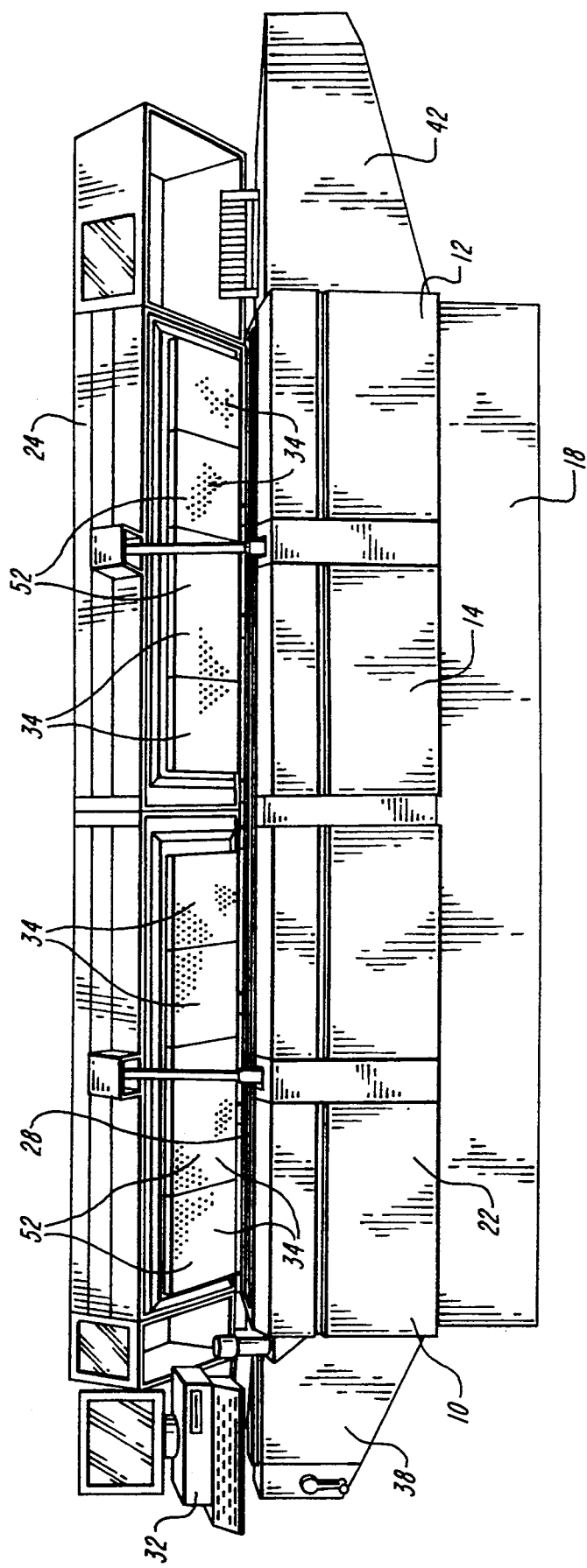
FIG. 2 is a front elevational view of the convection furnace of FIG. 1 in an open position.
Figure 3:
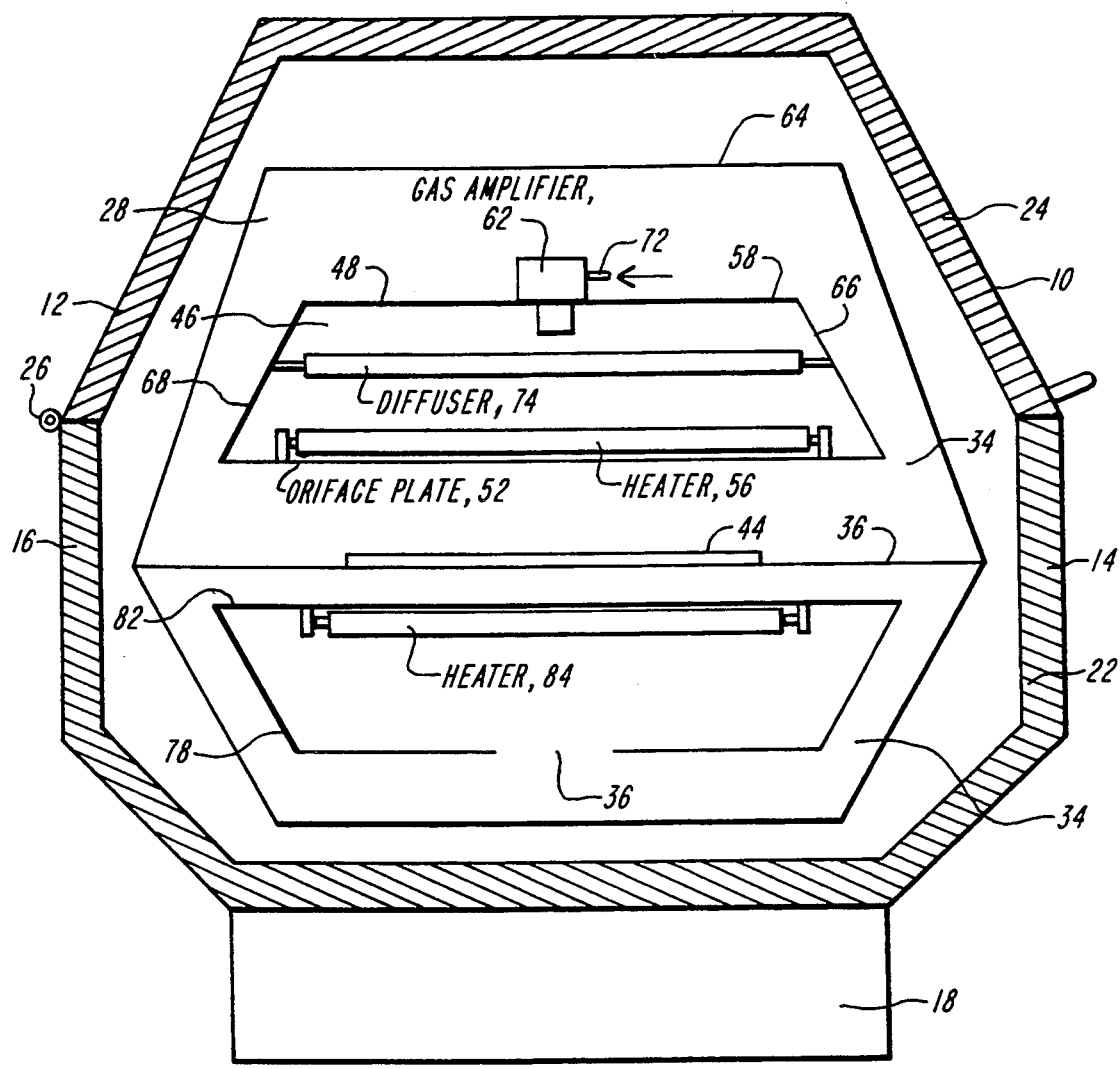
FIG. 3 is a cross-sectional side view of the furnace of FIG. 1.

A recirculation impingement convection furnace 10 according to the present invention is shown in FIGS. 1 and 2. The furnace is generally elongated in the direction of product travel therethrough and comprises a thermally insulated housing 12 having elongated front and back sides 14, 16 parallel to the direction of travel. An elongated base 18 supports the housing 12. The housing has a generally clam shell configuration in cross-section, as best seen in FIG. 3, in which a lower housing 22 is hingedly attached to an upper housing 24 along the elongated back side 16. The upper housing 24 can be rotated up about the hinge 26 to provide access to the interior 28 of the furnace for maintenance or repair. The upper housing 24 is illustrated in the raised position in FIG. 2. The housing walls are lined with any suitable thermally insulating material.

A control unit 32 is provided at one end of the housing. The control unit typically includes a computer, a video monitor, one or more input devices such as a keyboard or trackball, and a disk drive. The control unit controls the heating process in accordance with any desired parameters by controlling the product speed through the furnace and the temperature profile achieved by heaters within the furnace.

In the interior 28 of the housing 12, the furnace is divided into a plurality of heating zones 34. The furnace 10 illustrated in FIGS. 1 and 2 has sixteen zones, eight in the upper housing and eight in the lower housing. However, any number of zones may be provided, depending on the application. Similarly, only heating zones in the upper or in the lower housing may be used, if desired. Each upper heating zone abuts against adjacent zones in the direction of product travel through the furnace. Similarly, each lower heating zone abuts against adjacent zones. In this manner, substantially continuous heating may be provided along the length of the furnace.

A conveyor 36 extends the length of the housing between the upper and lower heating zones. The conveyor is generally formed as an open mesh belt to allow fluid to pass through. The belt may be formed from a metal or other material capable of withstanding the high temperatures in the furnace. Entry and exit areas 38, 42 for the conveyer are provided on each end of the housing. Product 44 is loaded onto the conveyor belt 36 at the entry area 38 and unloaded at the exit area 42. An entry and exit muffle on each end are provided as a transition zone between ambient temperature and pressure and the higher temperatures and pressures within the furnace.

Figure 4:
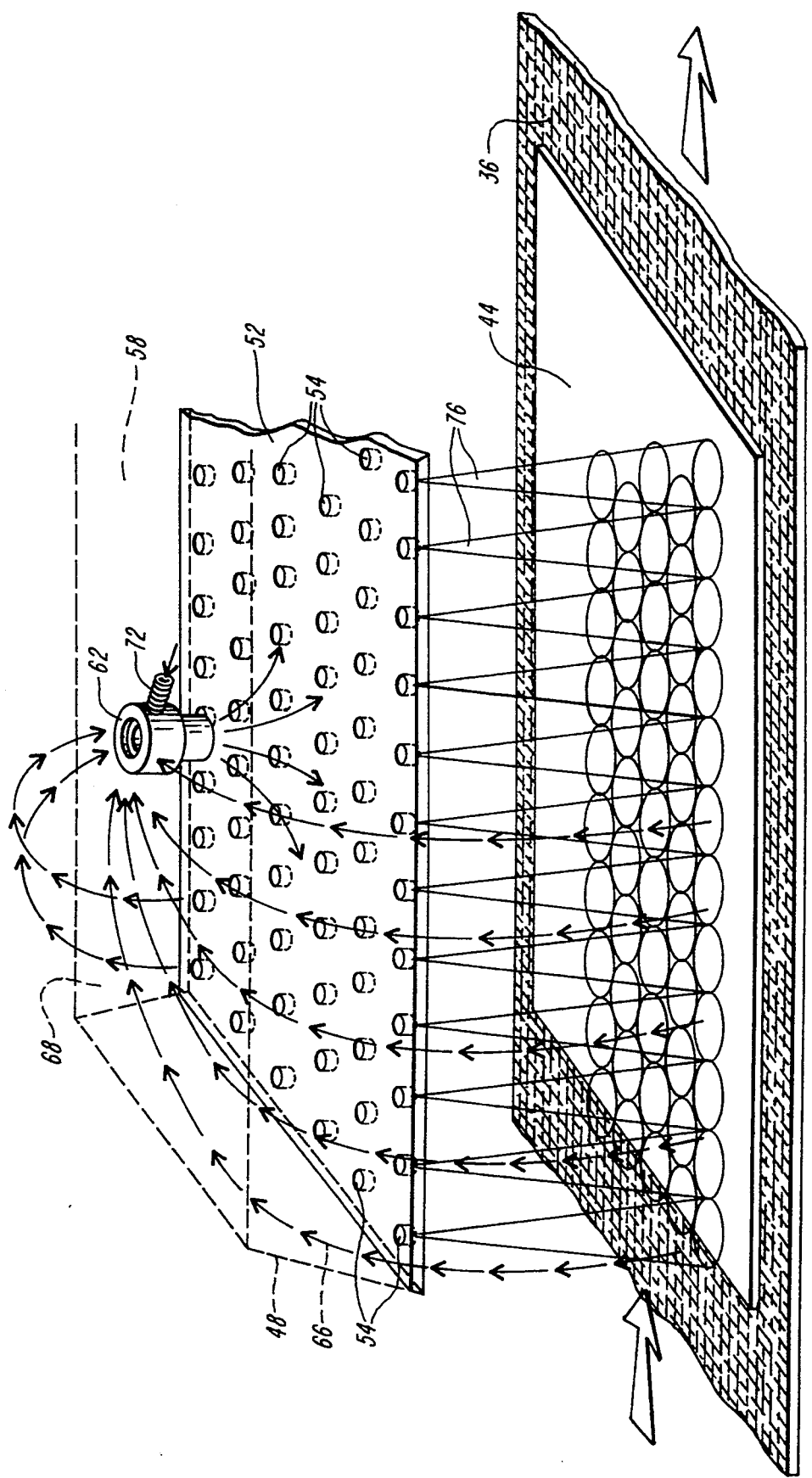
FIG. 4 is partial schematic illustration of the interior of the convection furnace according to the present invention.

The interior 28 of the furnace 10 is shown schematically in FIG. 3. Each upper heating zone 34 comprises a enclosure 48 defining a heating chamber 46 therein. The enclosure 48 typically is formed as a generally trapezoidally shaped box having side walls tapered toward the top. The box is formed from sheet metal or other material capable of withstanding high temperatures welded or otherwise sealed along edges to provide a substantially leak-proof chamber. The floor or lower surface 52 of the box 48 comprises a plate having a plurality of orifices 54 therein, as shown in FIGS. 2 and 4. One or more heating elements 56 are mounted in any suitable manner slightly above the orifice plate 52 inside the chamber 46. Any known heating elements suitable for use in a convection furnace, such as electric resistance heating elements, may be used. The heating elements preferably overlie most of the surface area of the orifice plate 52.

The ceiling or upper surface 58 of the box 48 includes an opening therein in which is mounted a gas amplifier 62. A gas plenum 64 surrounds the box's ceiling 58 and sides 66, 68 parallel to the elongated front and back sides 14, 16 of the furnace. The gas amplifier 62 includes an input inlet 72 for connection via a fluid flow line (not shown) to a source of high pressure gas, such as an air compressor or a tank of liquid nitrogen (not shown). The high pressure source may be located anywhere outside of the furnace and preferably is located in a separate room, which removes the noise, heat, and vibration typically generated by an air compressor from the furnace location.

For reflow solder applications, the compressed gas is usually regulated to be supplied to the gas amplifier at between 40 to 70 psi, although the particular input pressure depends on the desired flow rates to be achieved, as explained more fully below. However, the input pressure generally must be at least 15 psi to efficiently drive the amplifier in the high pressure environment of a heating chamber. The gas amplifier can operate at high input pressures, for example, 100 psi or greater, if necessary. However, it is generally desirable to operate the furnace with the minimum amount of input gas, which is achieved by minimizing the input pressure.

Figure 11:
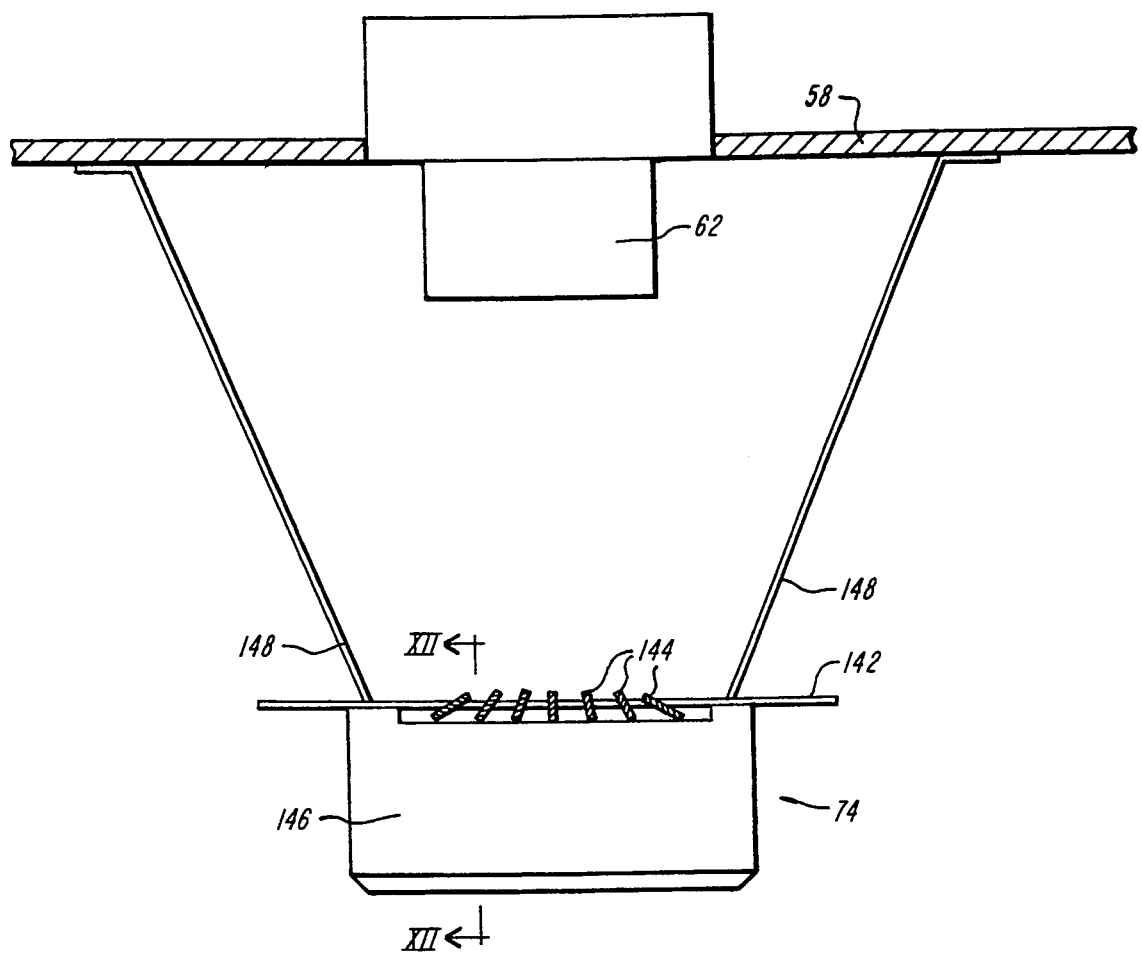
FIG. 11 is a partial cross-sectional view of an embodiment of a diffuser for use in the convection furnace of the present invention.
Figure 12:
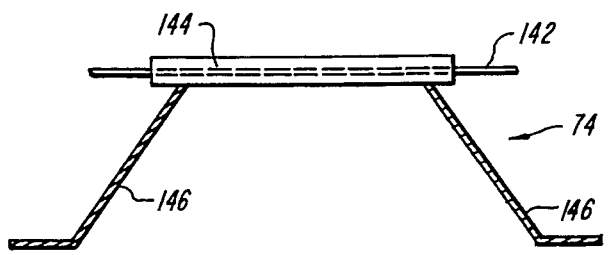
FIG. 12 is a cross-sectional view along line XII—XII of FIG. 11.

In operation, shown schematically in FIG. 4, the gas amplifier 62, to be described more fully below, creates a flow of air or other suitable gas into the heating chamber. A diffuser 74 is mounted inside the box in any suitable manner below the exit of the gas amplifier to distribute the gas flow over the heating elements 56. As shown in FIGS. 11 and 12, the diffuser may comprise a plate 142 having a series of parallel, differently angled louvers 144 and a pair of spoilers 146 perpendicular to the louvers. The plate 142 may be mounted from brackets 148 attached to the sides or top of the enclosure 48. Alternatively, other diffuser configurations may be used, if desired. As the gas flows over the heating elements 56, the gas is heated by convective and conductive heat transfer.

In an ambient environment, the output flow would entrain further gas adjacent the exit of the gas amplifier, further increasing the gain. However, in the environment of the heating chamber, no additional gas is available for further entrainment. Instead, a secondary circulation pattern is established within the chamber 46. This circulation pattern causes substantially all of the entering gas to pass rapidly and frequently over the surfaces of the heating elements 56, thereby ensuring rapid and efficient heat transfer to the gas.

Because of this effect, the rate of heat transfer to the gas becomes a function of the output flow rate from the gas amplifier. In reflow solder convection furnaces, the output flow rate of gas typically ranges between 20 and 30 ft$^3$/min, although higher or lower flow rates may be desired depending on the heat transfer requirements of the application. To increase the rate of heat transfer for a given gas amplifier, the rate of input flow from the source of compressed gas is increased. Similarly, to decrease the rate of heat transfer, the rate of input flow is decreased. The rate of input flow is increased or decreased by increasing or decreasing the pressure of the input gas from the source of compressed gas. This manner of controlling the rate of heat transfer provides a more rapid response than is provided in prior art systems, such as fan-based systems, which control the heat transfer rate by controlling the temperature of the heating element. In fan-based systems, the rate of heat transfer cannot be as rapidly controlled by increasing or decreasing fan speed.

As further shown in FIG. 4, the heated gas flows through the orifices 54 in the lower orifice plate 52, which direct the flow downwardly to impinge on the product 44 on the conveyor 36 below. Heat is transferred from the gas to the product. The spacing and diameter of the orifices 54 and the distance of the orifices from the product 44 may be chosen so the flow impinging on the product is substantially laminar and has a velocity of zero when at the product. The flow has the configuration of a plurality of cones 76, each cone emanating from an orifice 54. Adjacent cones touch but do not overlap at the product, thereby obviating any mixing of the flows from adjacent cones. Also, the cones substantially cover all of the product area. In this manner, a substantially even heat transfer from the gas flow to the product is achieved. Additionally, the downward flow of gas impinges on the product and returns directly upward in the opposite direction until it exits the cones. Thus, the velocity of the gas impinging on the product 44 is substantially zero, and a uniform pressure prevails over the product. The product is not jostled or otherwise disturbed by the flow of gas, but is instead retained in place by the uniform pressure.

The gas returns through the spaces left between the downwardly directed cones 76 of flow. The gas is recirculated back to the gas amplifier 62 via the plenum 64. In a typical solder reflow furnace, the gas is changed approximately eight times per second. Also, because the plenum 64 extends only along the sides of the heating zones 34 adjacent the elongated sides 14, 16 of the housing 12, the heating from zone to zone is continuous and no pressure differentials are created between zones.

Each lower heating zone 34 similarly comprises a substantially leak proof heating chamber 78 located below the conveyor 36. The ceiling or upper plate 82 of the lower heating chamber comprises an orifice plate, typically located directly below the conveyor 36. One or more heating elements 84 are mounted directly below the orifice plate. Air or other gas enters the chamber from an opening 86 in the floor or lower plate of the box, is heated, and rises through the orifices to the product 44 on the conveyor 36. A gas amplifier may be used in the lower heating chamber if desired. The gas amplifier increases the efficiency of the lower heating chamber, since the heated gas rises naturally and the product is in close proximity to the heat source in the lower chamber.

Figure 5:
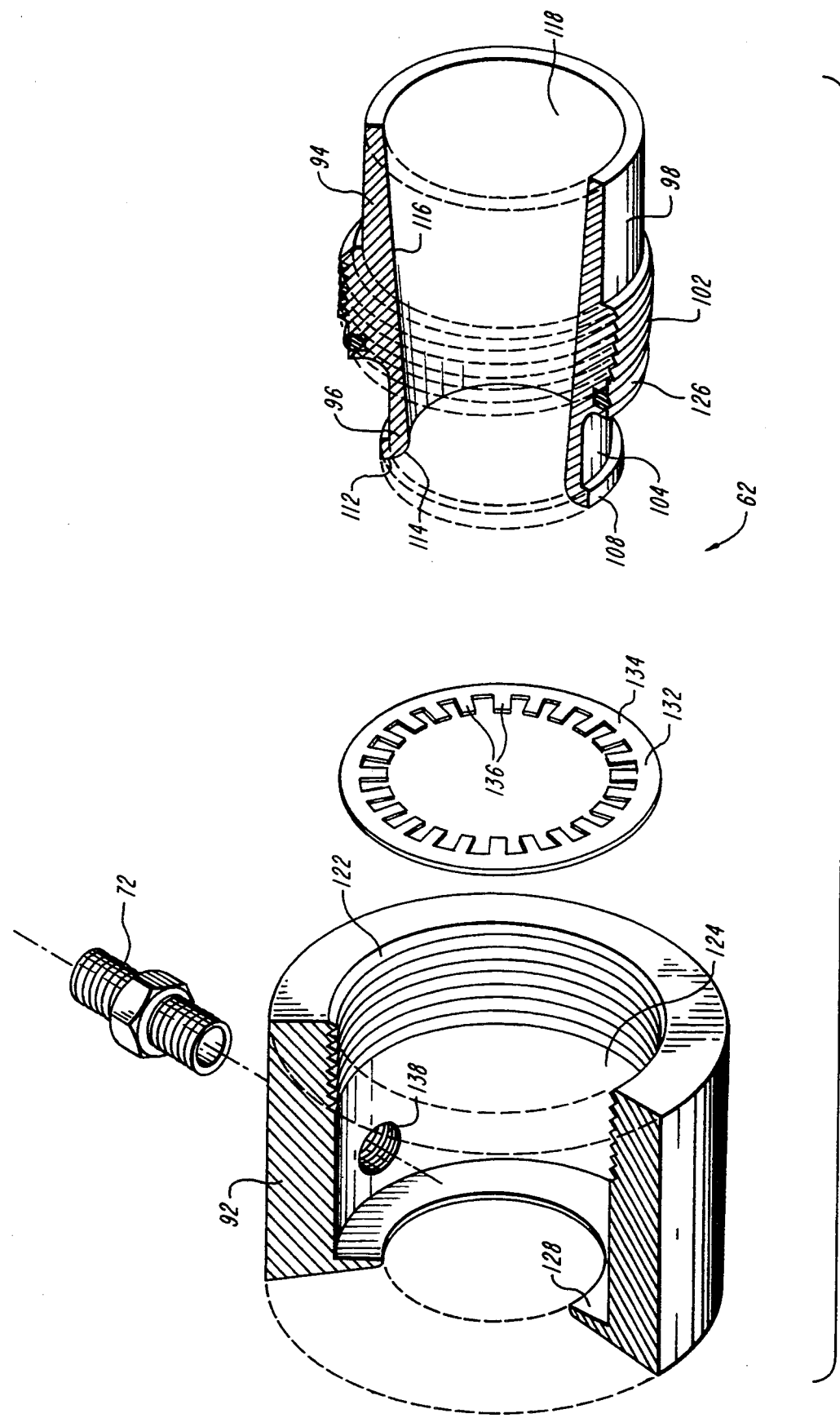
FIG. 5 is an exploded view of a gas amplifier according to the present invention.
Figure 6A:
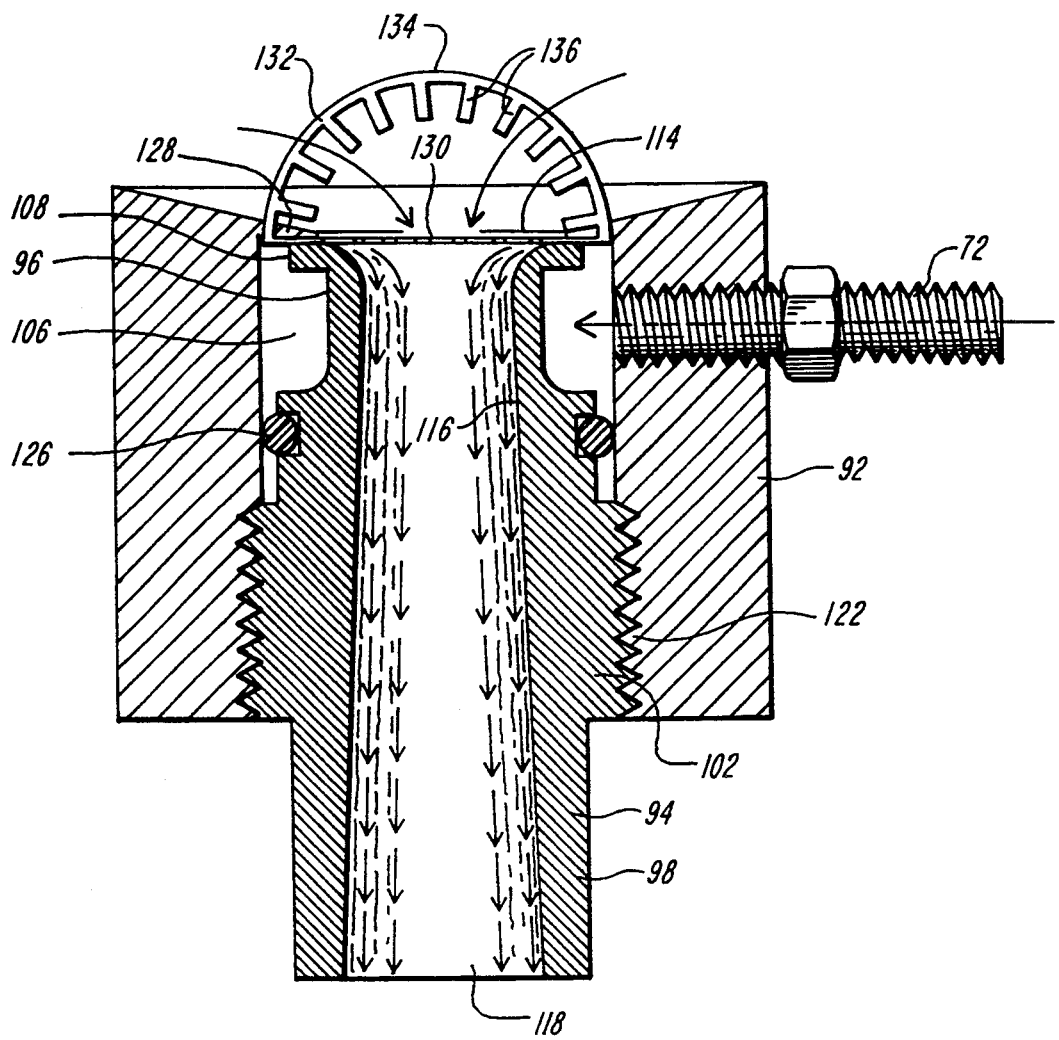
FIG. 6A is a cross-sectional view of a gas amplifier according to the present invention.

Referring to FIGS. 5 and 6A, the gas amplifier 62 of the present invention comprises a gas amplifier body 92 and a nozzle 94 which fits inside the amplifier body. The amplifier body and nozzle may be manufactured, for example, by known machining methods, from any suitable material capable of withstanding high temperature environments. Metals, such as stainless steel, or ceramics, such as alumina, may be used. The outer surface of the nozzle comprises an orifice section 96 and a barrel 98 separated by a threaded section 102. The orifice section comprises an annular recess 104 which cooperates to form an annular chamber 106 inside the gas amplifier when the nozzle 94 is inserted into the amplifier body 92. The orifice section 96 terminates at a lip 108 having a substantially flat surface 112. The barrel 98 comprises a substantially cylindrical member extending from the threaded section 102 at the opposite end of the nozzle from the orifice section 96.

The interior of the nozzle 94 comprises an entrance area 114 having a Coanda profile, which may be formed as a series of flat surfaces. The Coanda profile of the entrance area transitions to a bore 116. The illustrated bore is slightly outwardly tapered toward the exit 118 of the nozzle 94, although straight bores or inwardly tapered bores may alternatively be used.

The amplifier body 92 comprises a threaded section 122 to matingly receive the threaded section 102 of the nozzle 94. A bore 124 is provided inside the amplifier body to receive the orifice section 96 of the nozzle 94. The bore 124 and the annular recess 104 of the nozzle orifice section 96 cooperate to form the annular chamber 106. An O-ring 126, which may be formed from an elastomeric material such as a high density, high temperature rubber, seals the chamber 106 between the orifice section 96 and the threaded section 102. An annular shoulder 128 having a substantially flat surface is provided to correspond to the surface 112 of the lip 108 of the nozzle. A toothed shim 132 is provided which fits between the shoulder 128 and the lip 108. The nozzle 94 is inserted into the amplifier body 92 until the shim 132 abuts the shoulder 128 and the lip 108 to provide a gap 130 therebetween. The shim may be formed from a material capable of withstanding high temperatures. Metals, such as stainless steel, or ceramics, such as alumina, are suitable.

As can best be seen in FIG. 6A, which shows the shim 132 with a 90° bend solely for purposes of clarity, the outer diameter of the shoulder 128 is greater than the diameter of the lip 108, whereas the inner diameter of the shoulder overhangs the flat surface 112 of the lip. The shim 132 is formed as a circular rim 134 having a plurality of spaced, inwardly directed teeth 136. The inner diameter of the shim rim 134 is greater than the outer diameter of the lip 108. Thus, the shim rim 134 does not block the flow path through the gap 130 from the annular chamber 106. The teeth 136 of the shim extend inwardly to abut the lip 108 such that the ends of the teeth contact the lip 108 of the nozzle 94 and the shoulder 128 of the amplifier body 92, thereby setting a substantially even gap 130 between the nozzle and the body.

A gas inlet 72 is provided on the exterior of the body 92. A radially disposed passage 138 extends from the inlet to the bore 124 of the body. The passage is located to communicate with the annular chamber 106. A source of compressed gas (not shown) is connected to the inlet 72. The compressed gas is fed to the annular chamber 106 via the passage 138. The gas flows through the spaces between the teeth 136 of the shim 132 and entrains the gas in the plenum 64 at the upstream end of the gas amplifier to create a flow which follows the Coanda profile of the nozzle entrance area 114 and along the bore 116 of the nozzle to the exit 118. From the exit, the flow enters the heating chamber 46.

Figure 7A:
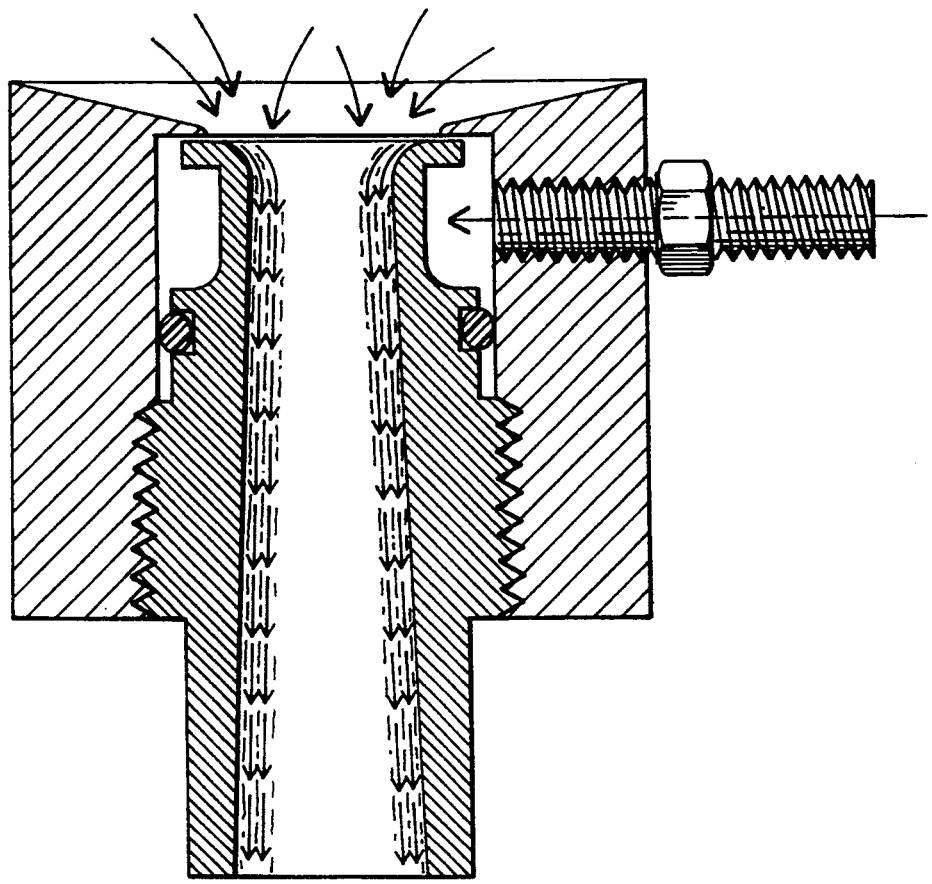
FIG. 7A is a cross-sectional view of an unshimmed gas amplifier having an even gap.
Figure 7B:
FIG. 7B is a cross-sectional view of the flow pattern exiting from the gas amplifier of FIG. 7B.

The heating chamber 46 becomes pressurized from the input of pressurized gas and from the heating of the gas. Heated gas expands; however, the volume of the heating chamber is fixed, so the pressure inside the chamber 46 increases. Typically, the static pressure in the heating chamber of a convection furnace for solder reflow applications can be as high as 5 to 6 inches of water, and the temperature can be as high as 300° to 350° C. As discussed above, the increased pressure in the chamber causes a problem for typical prior art unshimmed gas amplifiers. As seen in FIGS. 7A and 7B, the flow out of the nozzle of an unshimmed gas amplifier is generally cylindrical, having an area of relatively low flow in the center. The pressure in the center is at generally the pressure of the amplifier entrance, which is lower than the pressure in the heating chamber. Thus, the high pressure in the chamber tends to cause a back flow to form up the center of the cylinder. Eventually, the back flow travels up the bore of the nozzle, the Coanda profile flow breaks down, and the air amplifier ceases to operate effectively to increase the flow rate.

Figure 8A:
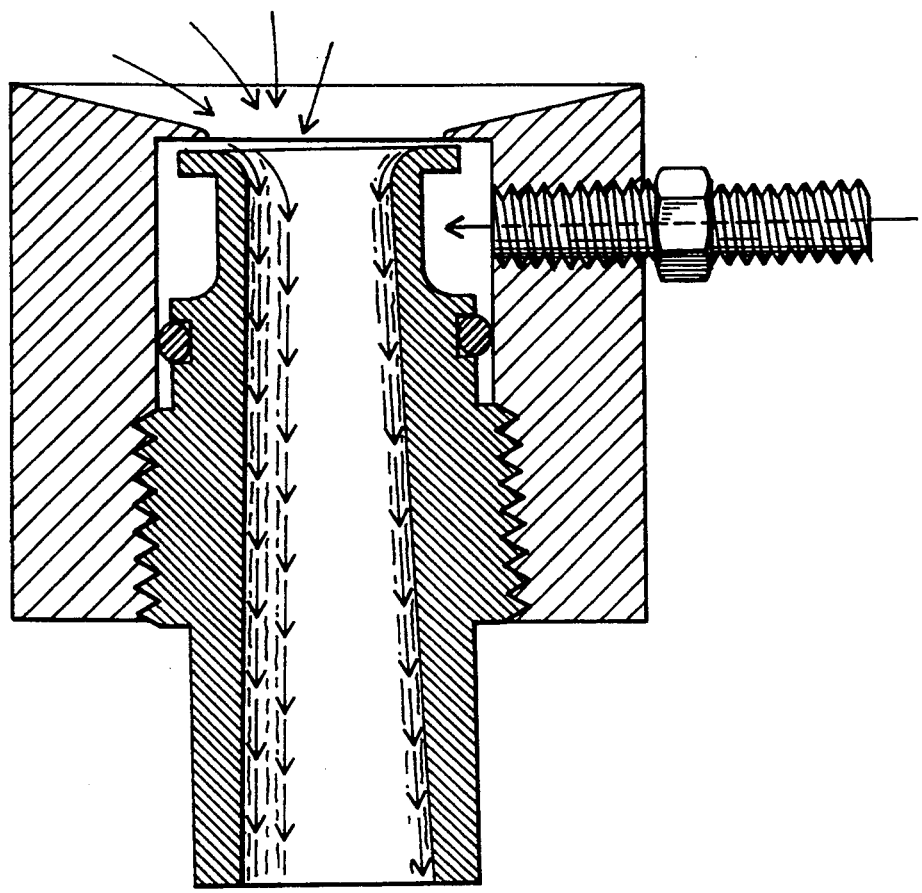
FIG. 8A is a cross-sectional view of an unshimmed gas amplifier having an uneven gap.
Figure 8B:
FIG. 8B is a cross-sectional view of the flow pattern exiting from the gas amplifier of FIG. 8A.

Further, with an unshimmed gas amplifier, the gap is usually uneven, because it is difficult to machine the opposing faces to be substantially flat and parallel. An uneven gap causes asymmetrical flows, as shown in FIGS. 8A and 8B. The low or no flow segments of the amplifier reduce the gain achievable by the amplifier and are further susceptible to back flowing caused by the high pressure inside the chamber.

Figure 6B:
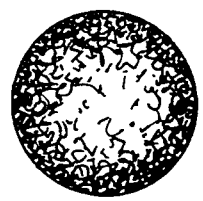
FIG. 6B is a cross-sectional view of the flow pattern exiting from the gas amplifier of FIG. 6A.

In the present invention, it has been determined that inclusion of a toothed shim tends to slightly break up the flow to get around each tooth. The flow reforms into a sheet downstream of each tooth, although with a greater thickness than if the flow were not broken up. The greater thickness causes the flow to "fill in" more of the center of the cylinder of flow, forming a more columnar flow, as shown in FIG. 6B. In ambient environments, a thicker flow reduces the achievable gain of the amplifier. However, in the environment of a heated, pressurized chamber, this substantially thicker cylindrical or columnar flow is able to resist the back pressure within the chamber, and consequently, a back flow up the center area does not form.

Figure 9:
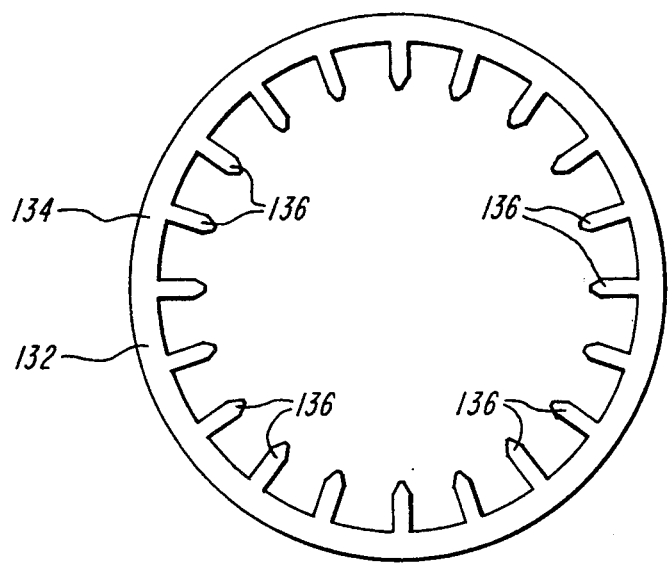
FIG. 9 is a frontal view of a further embodiment of a shim used with the gas amplifier of the present invention.
Figure 10:
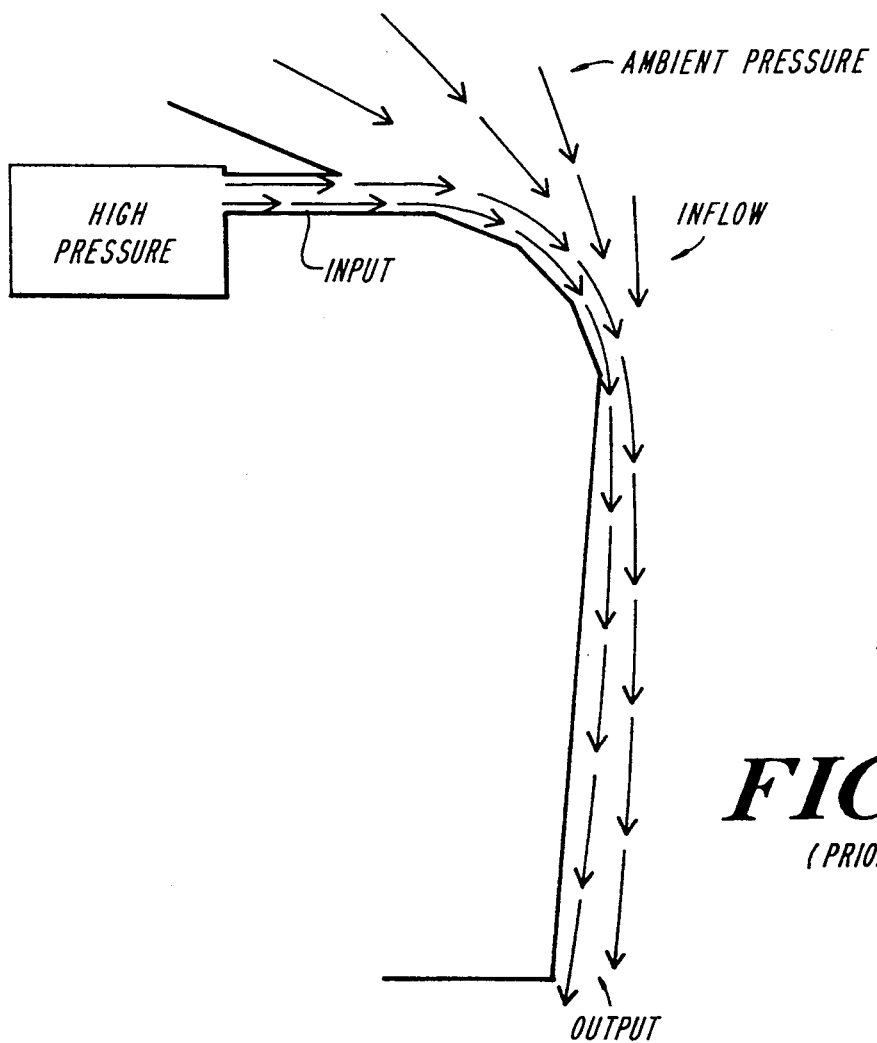
FIG. 10 is a schematic illustration of the Coanda effect.

Preferably, the shim is provided with relatively narrow teeth, such that the area of the spacing between the teeth is greater than the area of the teeth, to minimize the blockage of the input opening through the annular gap. Prior art gas amplifier shims have typically used wide teeth, which block 50% or more of the input flow opening. It has been determined, however, that such great blockage impedes the reformation of the flow, particularly at low input pressures. Thus, minimizing the blockage aids in the reforming of the flow into a sheet downstream of the teeth. Within this parameter, a variety of shim configurations, having different numbers, spacings, and shapes of teeth, may be used. For example, an alternative configuration is shown in FIG. 9, in which some of the teeth have a tapered shape.

The gain and output flow rate in the heating chamber are determined mainly by the thickness of the shim. Shims of lesser thicknesses produce greater gains; however, the input flow is less. Thus, even with a high gain, a low input flow may result in an output flow which is too thin and not capable of resisting the back pressure in the chamber. Thicker shims allow greater input flows, producing thicker output flows, but the achievable gain is less. Thus, in choosing the shim thickness, a balance between gain and back pressure resistance must be found. In solder reflow furnaces, shims having a thickness in the range of 0.001 to 0.006 inch have been found to give satisfactory results, achieving gains between approximately 10 and 20 while providing good back pressure resistance.

The particular shim thickness chosen depends on the flow requirements of the particular heating zone or application in which the gas amplifier is to be used. To conserve input gas or air compressor power consumption, it is desirable to use as low an input flow as possible to achieve the desired heat transfer rate. However, if a greater heat transfer rate is required in a particular heating zone, a greater output flow rate must be provided, which may necessitate a thicker shim, even at the expense of reduced gain. Similarly, if a lesser heat transfer rate is acceptable in a particular heating zone, a thinner shim with lesser input flow but higher gain may suffice.

Table 1 shows test results for a shim found to be suitable for use at a supply pressure of 50 psi. The tested shim has an outer rim diameter of 1.3625 inch and an inner rim diameter of 1.2235 inch. The shim has twenty teeth, each having a width of 0.040 inch, and the diameter measured between the tips of the teeth was 0.975 inch.

TABLE 1

| | | 50 psi | | |
|---|---|---|---|---|
| Shim Thickness (inch) | Input Flow Rate (lpm) | Gain | Static Pressure (inch $H_2O$) | Critical Pressure (inch $H_2O$) |
| 0.0010 | 33 | 15 | 0.58 | 1.5 |
| 0.0015 | 55 | 12 | 0.90 | 3.8 |
| 0.0020 | 55 | 11.7 | 0.92 | 4.6 |
| 0.0025 | 78 | 12 | 1.55 | 5.0 |

The critical pressure was determined for a particular flow rate, shim thickness, and heating chamber by progressively minimizing the orifice outlet area, which increases the pressure in the chamber, until a back flow formed. The back flow was detectable by a large drop in static pressure inside the chamber. As shown in FIG. 1, for each shim thickness the static pressure measured inside the chamber during operation was less than the determined critical pressure for that chamber at 50 psi, indicating that no backflow occurred. Additionally, each shim provided a satisfactory gain.

The gas amplifier-based convection heat transfer system of the present invention has been described with reference to reflow solder convection furnaces, which operate at temperatures that are generally no greater than 300° to 350° C. However, the gas amplifier system of the present invention may also be used for higher temperature, higher pressure applications. To operate at temperatures above 350° C., the elastomeric O-ring 126 which seals the annular chamber 106 should be replaced with a metal or other type of seal capable of withstanding greater temperatures.

Generally, the gas amplifier system can provide effective convection heat transfer at temperatures as high as 800° to 1100° C. Above approximately 1000° to 1100° C., however, radiation heat transfer from the heating elements becomes the dominant mode of heat transfer, and the contribution of convection heat transfer to the total heat transfer rate becomes less. Thus, above approximately 1000° to 1100° C., providing convection heat transfer, although possible, is not generally efficient or cost effective.

The invention is not to be limited by what has been particularly shown and described, except as indicated by the appended claims.

I claim:

1. A convection furnace comprising:
    a thermally insulated housing;
    a sealed, pressurizable heating box mounted inside said housing defining a heating chamber;
    a heating element mounted inside said box; and
    a gas plenum inside said housing above said heating box; and
    a gas amplifier mounted in an upper section of said box to draw gas from said plenum into said box for circulation over said heating element, said gas amplifier comprising:
        a nozzle having an entrance from said plenum, said entrance being formed with a Coanda profile, and an exit to said heating chamber,
        opposed interior surfaces configured to define an annular gap surrounding said entrance of said nozzle, one of said opposed surfaces being contiguous with said Coanda profile of said nozzle,
        a gas input inlet for connection to a source of pressurized gas, said inlet being in fluid communication with said annular gap to introduce a pressurized input gas from the source of pressurized gas to said annular gap for flow over said Coanda profile of said nozzle and into said heating chamber, whereby gas in said plenum becomes entrained in said flow of input gas, and
        a shim disposed between said opposed surfaces to define the width of said annular gap, said shim having a plurality of radially inwardly extending teeth thereon configured to protrude into a flow passage of said nozzle, whereby said flow of input gas and entrained gas becomes capable of withstanding pressure in said heating chamber.

2. The convection furnace of claim 1, wherein said input inlet of said gas amplifier further comprises an annular chamber surrounding a portion of said nozzle.

3. The convection furnace of claim 1, wherein said nozzle has an outwardly tapered configuration downstream of said Coanda profile.

4. The convection furnace of claim 1, wherein said heating box further comprises a lower plate having a plurality of orifices therein, whereby heated gas in said heating chamber flows through said orifices.

5. The convection furnace of claim 4, further comprising a surface below said heating box for supporting product to be heated, whereby said heated gas which flows through said orifices in said lower plate of said heating box impinges on the product to heat the product.

6. The convection furnace of claim 5, wherein said surface below said heating box comprises a conveyor.

7. The convection furnace of claim 1, further comprising a plurality of sealed, pressurizable heating boxes arranged adjacent each other in a row in said housing, each of said heating boxes having a heating element mounted therein and a gas amplifier mounted in an upper surface thereof.

8. The convection furnace of claim 7, wherein said gas plenum surrounds said plurality of heating boxes on at least the top side and two opposed sides thereof.

9. The convection furnace of claim 8, wherein each of said heating boxes further comprises a lower plate having a plurality of orifices therein, whereby heated gas in each of said heating boxes flows through said orifices and into said plenum, whereby said heated gas is recirculatable to said gas amplifiers.

10. The convection furnace of claim 7, further comprising a conveyor extending beneath said row of heating boxes for transporting product to be heated.

11. The convection furnace of claim 10, wherein each of said heating boxes further comprises a lower plate having a plurality of orifices therein, wherein heated gas in each of said heating boxes flows through said orifices for impingement upon product on said conveyor.

12. The convection furnace of claim 1, further comprising a diffuser mounted within said heating box to distribute said flow of input gas over said heating element.

13. The convection furnace of claim 1, wherein said shim enables said input flow from said gas amplifier to withstand a pressure of at least 4 inches of water inside said heating chamber.

14. A convection furnace comprising:
- a sealed, pressurizable enclosure defining a heating chamber therein;
- a heating element mounted inside said sealed enclosure, whereby gas in said enclosure is convectively heated by flow over said heating element;
- an outlet from said enclosure for discharging a flow of heated gas from said enclosure; and
- a gas amplifier mounted in an upper section of said enclosure to draw gas from outside said enclosure for circulation over said heating element, said gas amplifier comprising:
  - a nozzle having an entrance outside said enclosure, said entrance being formed with a Coanda profile, and an exit inside said enclosure,
  - opposed interior surfaces configured to define an annular gap surrounding said entrance of said nozzle, one of said opposed surfaces being contiguous with said Coanda profile of said nozzle,
  - a gas input inlet connectable to a source of pressurized gas, said inlet being in fluid communication with said annular gap to introduce a pressurized input gas from the source of pressurized gas to said annular gap for flow over said Coanda profile of said nozzle and into said heating chamber, whereby gas outside said enclosure becomes entrained in said flow of input gas, and
  - a shim disposed between said opposed surfaces to define the width of said annular gap, said shim having a plurality of radially inwardly extending teeth thereon configured to protrude into a flow passage of said nozzle, whereby said flow of input gas and entrained gas becomes capable of withstanding pressure in said heating chamber.

15. The convection furnace of claim 14, wherein said input inlet of said gas amplifier further comprises an annular chamber surrounding a portion of said nozzle.

16. The convection furnace of claim 14, wherein said nozzle has an outwardly tapered configuration downstream of said Coanda profile.

17. The convection furnace of claim 14, wherein said shim has a width from 0.001 inch to 0.006 inch.

18. The convection furnace of claim 14, wherein said shim enables said input flow from said gas amplifier to withstand a pressure of at least 4 inches of water inside said heating chamber.

19. The convection furnace of claim 14, further comprising a diffuser mounted within said enclosure to distribute said flow of input gas over said heating element.

20. The convection furnace of claim 19, wherein said diffuser comprises a series of parallel louvers and a series of parallel spoilers mounted perpendicular to said louvers.

21. The convection furnace of claim 14, wherein said heating element comprises an electric resistance heating element.

22. The convection furnace of claim 14, wherein said gas amplifier is formed from a body section and a nozzle section adjustably attachable to said body section.

23. The convection furnace of claim 22, wherein said shim is configured to fit between said body section and said nozzle section.

24. The convection furnace of claim 14, wherein the spacing between said teeth has a greater area than the area of said teeth.

* * * * *